(12) United States Patent
Ishida

(10) Patent No.: US 6,214,649 B1
(45) Date of Patent: Apr. 10, 2001

(54) INTEGRATED CIRCUIT PACKAGE

(75) Inventor: Yoshihiro Ishida, Tanashi (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/373,998

(22) Filed: Aug. 16, 1999

(30) Foreign Application Priority Data

Aug. 17, 1998 (JP) .................................................. 10-230520

(51) Int. Cl.[7] .................................................. H01L 21/44
(52) U.S. Cl. .................... 438/126; 438/106; 438/125; 438/127
(58) Field of Search .................................. 438/106, 125, 438/126, 127

(56) References Cited

U.S. PATENT DOCUMENTS

| | | | |
|---|---|---|---|
| 5,756,380 | * 5/1998 | Berg et al. | 438/126 |
| 5,905,634 | * 5/1999 | Takeda et al. | 361/704 |
| 6,019,932 | * 2/2000 | Kambara | 264/510 |
| 6,114,192 | * 9/2000 | Tsunoda et al. | 438/126 |
| 6,121,069 | * 9/2000 | Boyko et al. | 438/106 |

* cited by examiner

Primary Examiner—Matthew Smith
Assistant Examiner—V. Yevsikov
(74) Attorney, Agent, or Firm—Dennison, Scheiner, Schultz & Wakeman

(57) ABSTRACT

An IC chip is mounted on a circuit substrate by the flip chip mounting. A projection is provided for forming an eccentric space between the IC chip and the circuit substrate at a position deviated from a center of the IC chip. A sealing resin is injected in a space between the IC chip and the circuit substrate.

10 Claims, 7 Drawing Sheets

(a)

(b)

(c)

(d)

(a)

(b)

(c)

INTEGRATED CIRCUIT PACKAGE

BACKGROUND OF THE INVENTION

The present invention relates to an integrated circuit (hereinafter called IC) package, and more particularly to a flip chip mounting structure of a plastic ball grid array package.

In recent years, the flip chip bonding technique, in which a bare chip is directly mounted on a substrate by the face down process, has been improved as the semiconductor package is miniaturized at high density. There succeedingly appears portable telephones, each mounting a small package, so called CSP (chip size/scale package), having the approximately same size as the bare chip. The development of the CSP has rapidly been proceeded with the market requirement.

FIG. 7 shows steps for manufacturing an FC-PBGA (flip chip plastic ball grid array).

The step (a) shows a bonding step of a flip chip. In the step (a), a wafer having projected electrodes is cut into respective IC chips by dicing.

Flux is attached on the projected electrodes 2 on an IC chip 1 and the electrodes are mounted on bonding pads (not shown) formed on a circuit substrate 4. The IC chip 1 is secured to the circuit substrate 4 by reflowing the projected electrodes 2.

In the step (b), a sealing resin is put on the surface of the circuit substrate 4 and poured in the space between the IC chip 1 and the circuit substrate 4 by the capillary phenomenon to form a sealing resin 7. Thus, an IC mounting device 14 is formed. The IC mounting device is improved in resistivity to humidity and in resistivity to fatigue which is caused by the difference in line expansion coefficient between the IC chip 1 and the circuit substrate 4.

Thereafter, the sealing resin 7 is hardened by heat curing.

At the step (c), solder balls 11 are mounted on external electrode patterns 10, and secured thereto by reflowing the solder balls to form external solder electrodes 12 (step (d)).

In recent years, the IC chip becomes large in size, and accordingly the sealing resin is not sufficiently injected in the space between the IC chip and the circuit substrate. Consequently, there is formed voids in the sealing resin, which reduces the reliability of the IC mounting device.

Japanese Patent Publication 2607877 discloses a method for removing the voids by reducing the pressure of air surrounding IC chip.

FIG. 8 shows steps of the pressure reduction.

In the step (a), although the sealing resin 7 is poured in the space between the IC chip 1 and the circuit substrate 4 by the capillary phenomenon a void 6 is formed in the resin 7. The formation of void 6 is caused by various conditions such as the quality of resin, the size of the IC chip, conditions of the surface of the circuit substrate, and method of resin injection.

In the step (b), the IC mounting package 14 is put in a pressure reduced space, so that air in the void 6 is discharged from the sealing resin, thereby removing the void.

At the step (c), the sealing resin 7 is heated to be hardened.

FIG. 9 shows steps of an experiment for removing a void. In the experiment a glass chip is used for observing a void.

At steps (a, b), a void 6a generates in the sealing resin 7 between a glass chip 13 and the circuit substrate 4 at a central portion of the package 14.

At steps (c, d), the pressure of the ambient air of the package is reduced, so that the volume of the void increases.

Steps (e, f) show a condition where the pressure is further reduced, thereby the volume is more increased.

At steps (g, h), the air in the void 6 is discharged from the sealing resin 7, so that the void 6 disappears.

From the experiment it has been found that the void is not moved to a side of the package by pressure reduction, but the void gradually becomes large, and the air in the void spouts from the sealing resin when the void reaches the peripheral wall, thereby the void is compressed by the sealing resin to be disappeared.

The plastic ball grid array (PBGA) is standardized as MO-151 by the JEDEC (Joint Electron Device Engineering Council).

FIG. 10 is a plan view showing a PBGA having 5×5 grids, wherein positions of external electrode patterns 10 and positions of through-holes 14 each of which is formed in the circuit substrate 4 for connecting patterns on the surface and the underside of the circuit substrate 4.

In order to improve the electrical performance of the package, it is desirable to position the through-holes 14 a half-grid-pitch apart from the external electrode pattern 10.

The IC chip 1 is disposed at a central position of the package. As shown in FIG. 7, the pattern of the PBGA for the flip chip is approximately symmetrical with respect to an imaginary center line passing the center of the IC chip 1. In particular, the pattern in the central area is perfectly symmetrical. As a result, voids generated in a central zone are positioned in the central area.

In the conventional package, the position of each void generated in the sealing resin injection step irregularly changes at every package. The void generated in the central area becomes large by the pressure reduction. At last, the air pressure in the void balances with the pressure of the sealing resin so that the void does not break the outside wall of the resin. Thus, the void remains in the sealing resin. The moisture in the void and the stress of the void decrease the reliability of the package.

SUMMARY OF THE INVENTION

An object of the present invention is to provide an IC package without voids in a sealing resin, whereby the reliability of the IC package is increased.

Another object of the present invention is to provide an IC package which may be manufactured without increasing the number of steps for manufacturing ordinary IC packages, thereby increasing the productivity of the IC package.

According to the present invention, there is provided an IC package comprising, an IC chip mounted on a circuit substrate by flip chip mounting, formation means for forming an eccentric space between the IC chip and the circuit substrate at a position deviated from a center of the IC chip, and a sealing resin injected in a space between the IC chip and the circuit substrate.

The formation means is a projection provided in the space between IC chip and the circuit substrate.

The formation means is a recess formed on the circuit substrate.

The projection is provided on the circuit substrate.

The projection is provided on the underside of the IC chip.

The projection may be a part of a composing member of the circuit substrate.

The projection may be a part of a composing member of the IC chip.

The composing member is a circuit pattern.

The composing member is a projected electrode.

The recess is formed in a solder resist on the circuit substrate.

These and other objects and features of the present invention will become more apparent from the following detailed description with reference to the accompanying drawings.

DETAILED DESCRIPTION OF THE PREFERRED EMBODIMENT

Figure 1:
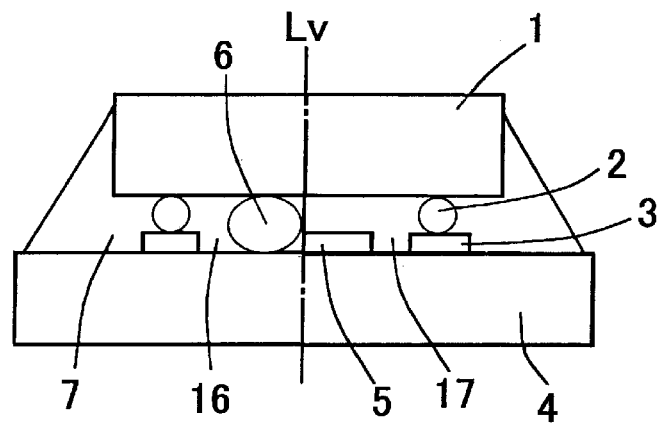
FIG. 1 is a side view of an IC package according to a first embodiment of the present invention, assuming that a sealing resin is transparent.
Figure 2:
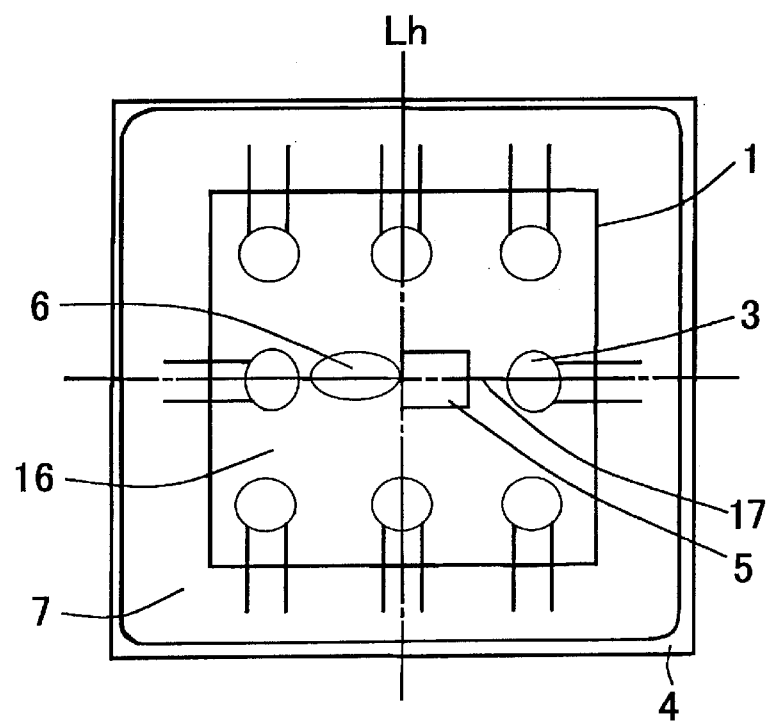
FIG. 2 is a seeing-through plan view of the IC package of FIG. 1.

Referring to FIGS. 1 and 2 showing the first embodiment of the present invention, the same parts as the above described conventional packages are identified by the same reference numerals as those of the prior arts.

A projection or pattern 5 is formed on the surface of the circuit substrate 4 at a position which is slightly deviated from the center of the IC chip 1. Accordingly, a space 16 and a narrow portion 17 are unsymmetrical with respect to imaginary center lines Lv and Lh passing the center of the IC chip 1.

Consequently, the void 6 which may be generated in the injected sealing resin 1 can not generate at the center point, generates in the space 16 deviated from the center.

Since the void 6 is positioned at the deviated location, the void expands in the eccentric condition and hence expands to the periphery at the deviated side. Therefore, the void can be quickly and easily removed.

The pattern 5 is formed at the same time as other circuit patterns, or may be formed as a circuit pattern as a part of a circuit pattern.

Figure 3:
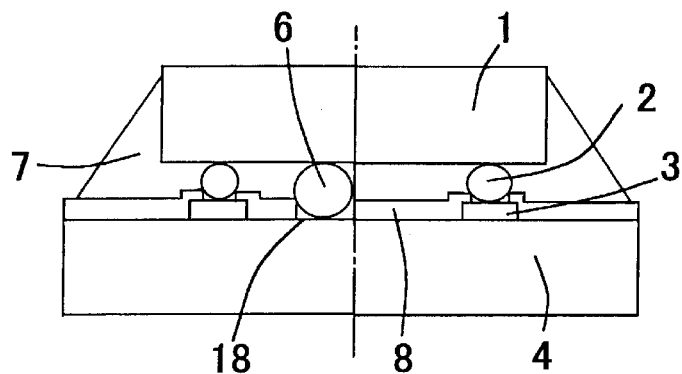
FIG. 3 is a side view of an IC package according to second embodiment of the present invention.
Figure 4:
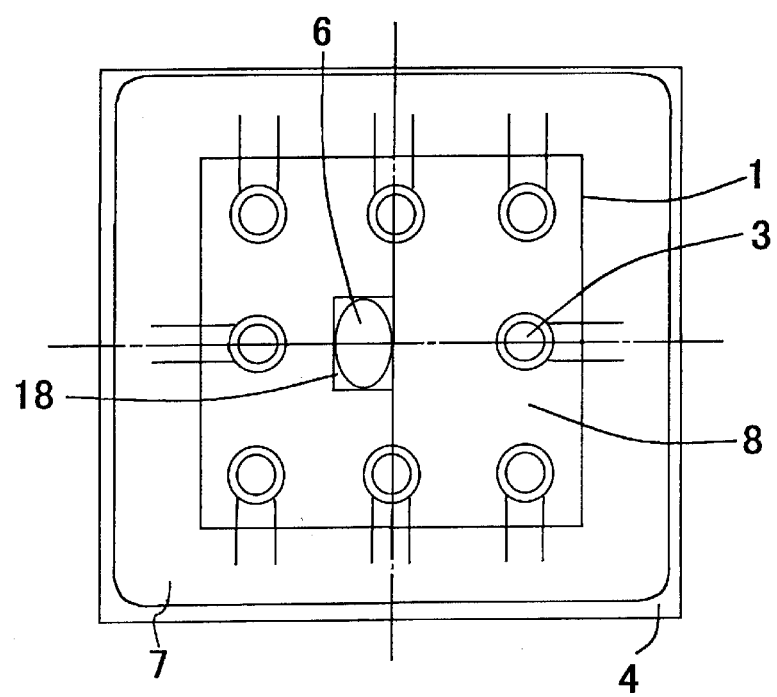
FIG. 4 is a seeing-though plan view of the IC package of FIG. 3.

Referring to FIGS. 3 and 4 showing the second embodiment of present invention. In the second embodiment, a solder resist 8 formed on the surface of the circuit substrate 4 so as to prevent the solder from sticking to the surface is provided with a hole to form a recess 18 in the solder resist 8 at a position unsymmetrical with respect to imaginary center lines.

Therefore, the void 6 is formed in the recess 18. The void can be easily removed at the pressure reduction step as above described in the first embodiment.

Figure 5:
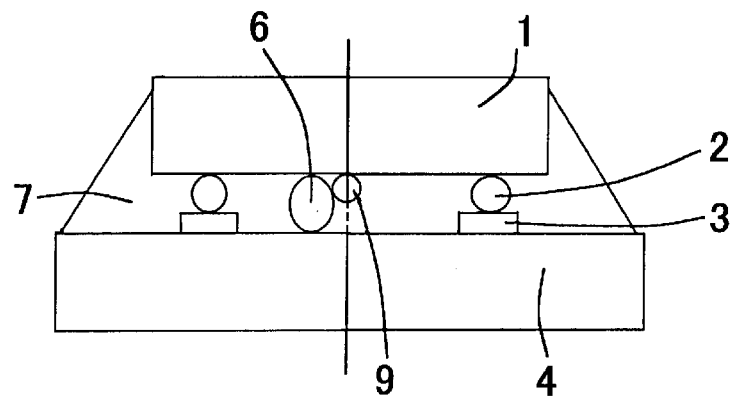
FIG. 5 is a side view of an IC package according to a third embodiment of the present invention.
Figure 6:
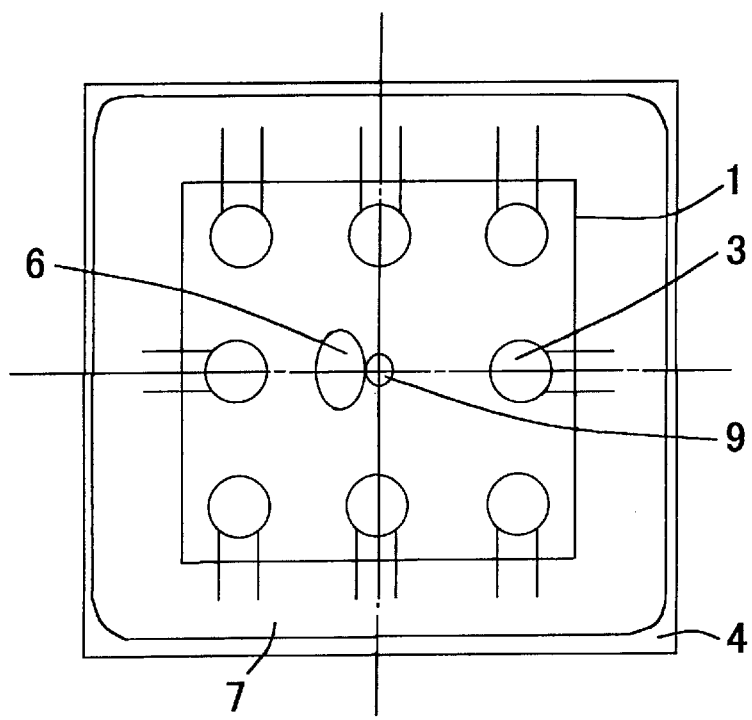
FIG. 6 is a seeing-through plan view of the IC package of FIG. 5.
Figure 7:
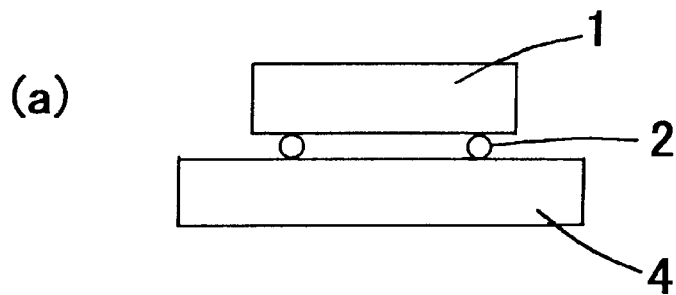
FIG. 7 shows steps for manufacturing an FC-PBGA.
Figure 7:
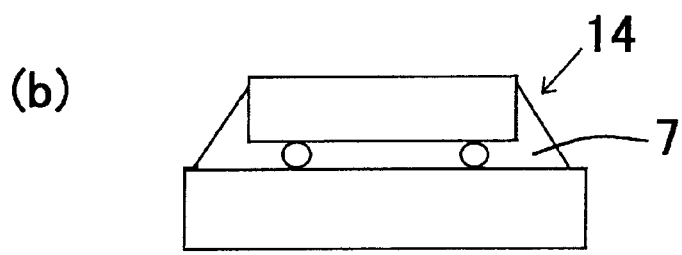
Figure 7:
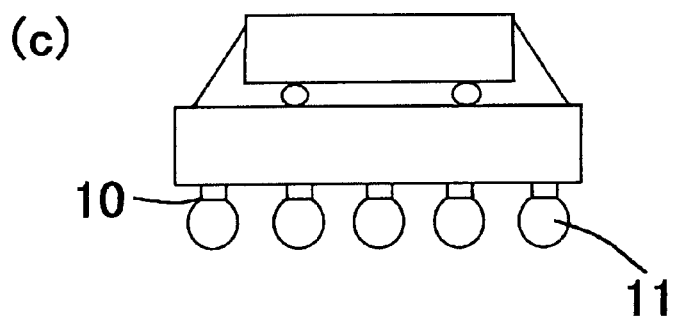
Figure 7:
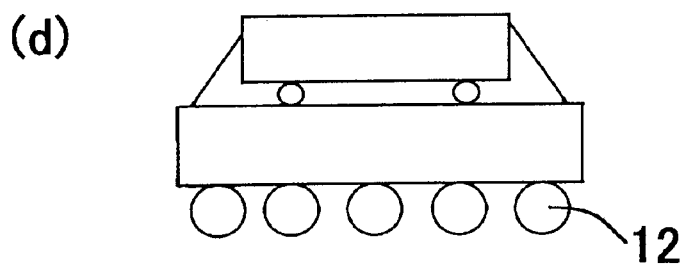
Figure 8:
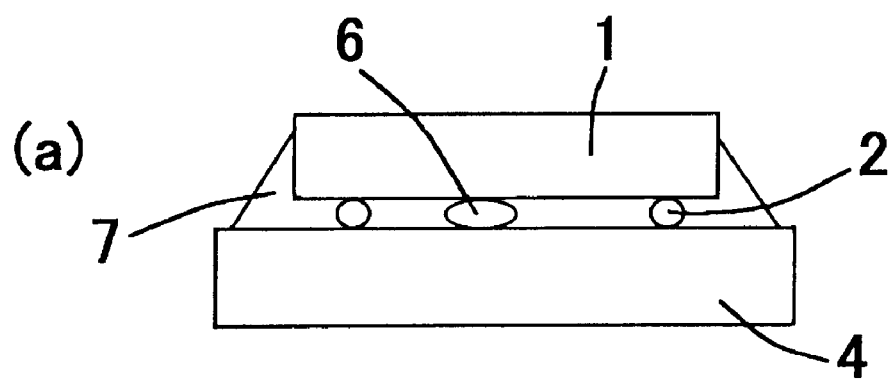
FIG. 8 shows steps of pressure reduction.
Figure 8:
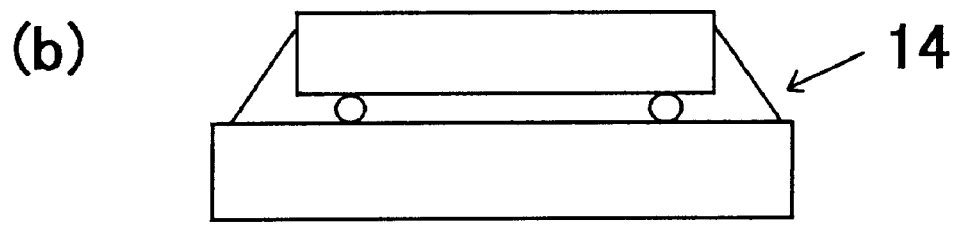
Figure 8:
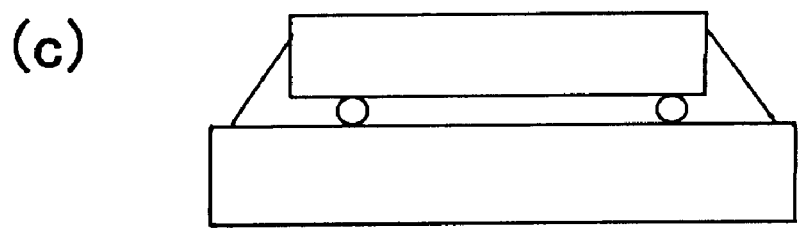
Figure 9:
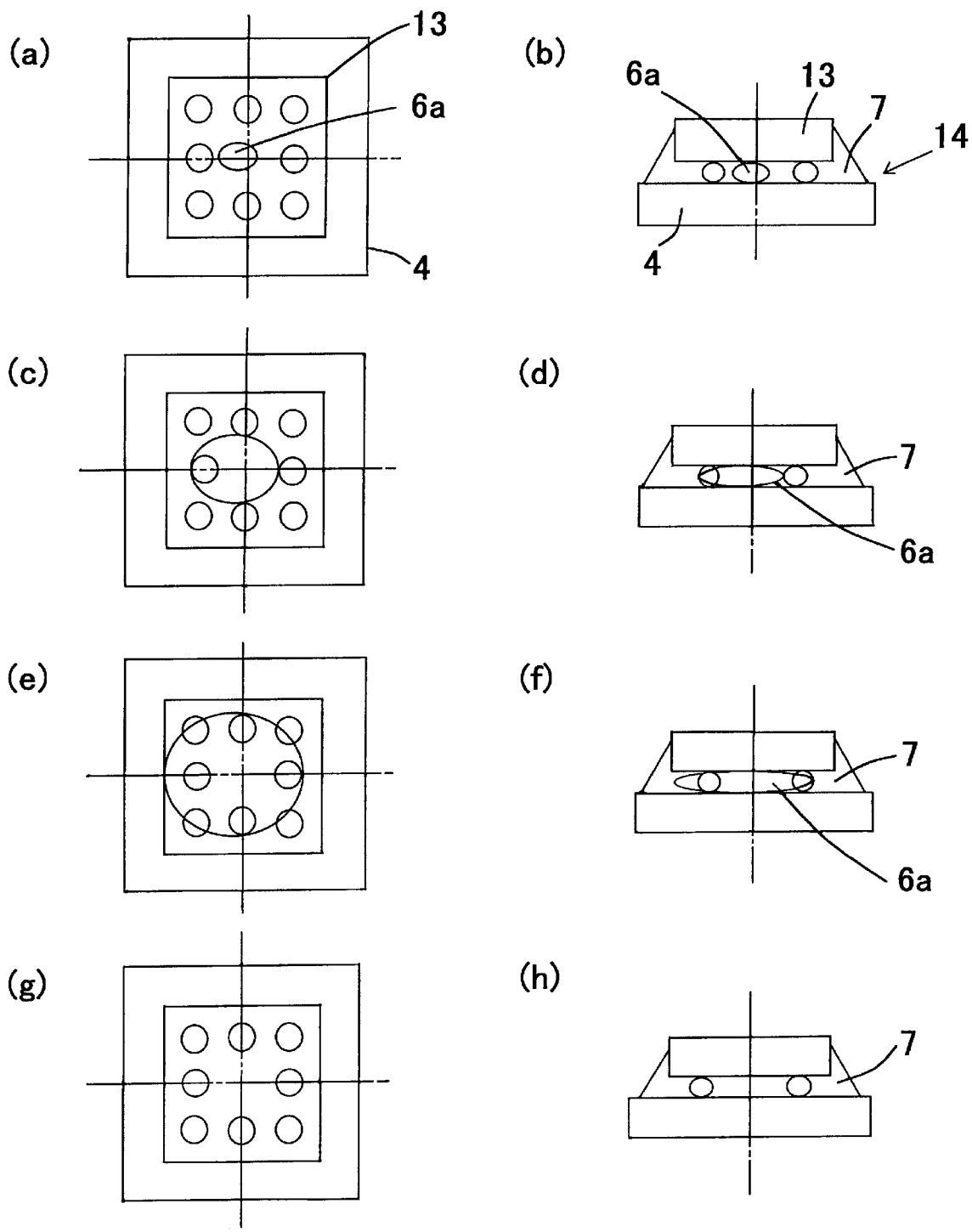
FIG. 9 shows steps of an experiment for removing a void.
Figure 10:
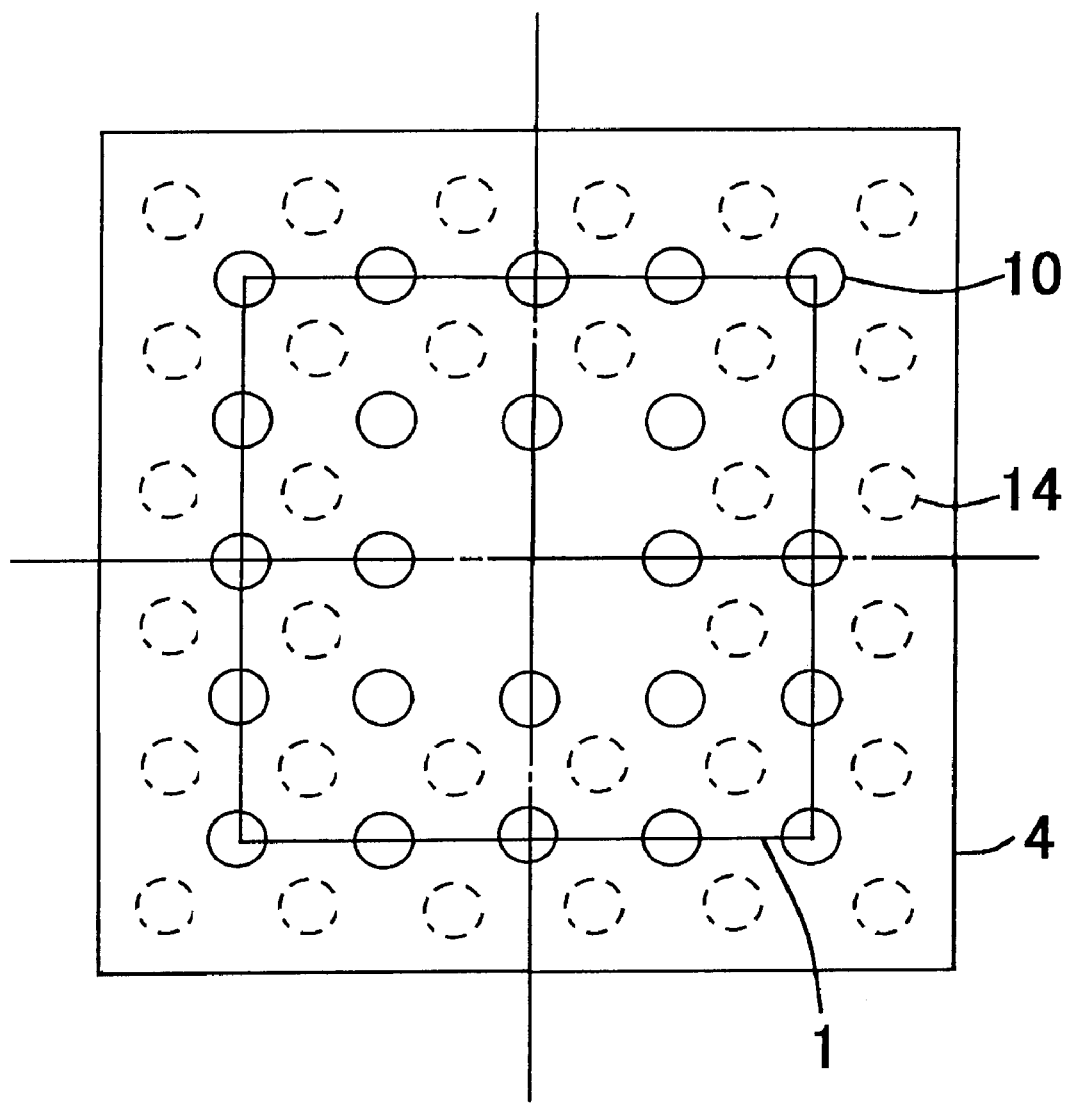
FIG. 10 is a plan view showing a PBGA.

Referring to FIGS. 5 and 6 showing the third embodiment of the present invention, a projection 9 is secured to the active surface of the IC chip 1 so as to project at a central position. Since the projection is provided at the central position, the void 6 is formed at an eccentric position.

The projection may be formed at the same time as the forming of projected electrodes as a projected electrode. In that case, the electrode contacts with a pattern on the circuit substrate 4.

In accordance with the present invention, since the void is formed in the sealing resin at a position deviated from a central area of the IC chip, the void can be quickly and easily removed.

Consequently, it is possible to prevent the reduction of the reliability of the IC package caused by the moisture in the void and the stress of the void.

Since the projection and recess for positioning the void are formed at the same time as the forming other elements, it is not necessary to add a special step. Thus, the productivity does not reduce.

While the invention has been described in conjunction with preferred specific embodiment thereof, it will be understood that this description is intended to illustrate and not limit the scope of the invention, which is defined by the following claims.

What is claimed is:

1. An IC package comprising:
   an IC chip mounted on a circuit substrate by flip chip mounting;
   formation means for forming an eccentric space between the IC chip and the circuit substrate at a position deviated from a center of the IC chip; and
   a sealing resin injected in a space between the IC chip and the circuit substrate.

2. The IC package according to claim 1 wherein the formation means is a projection provided in the space between IC chip and the circuit substrate.

3. The IC package according to claim 2 wherein the projection is provided on the circuit substrate.

4. The IC package according to claim 3 wherein the projection is a part of a composing member of the circuit substrate.

5. The IC package according to claim 4 wherein the composing member is a circuit pattern.

6. The IC package according to claim 2 wherein the projection is provided on an active surface of the IC chip.

7. The IC package according to claim 6 wherein the projection is a part of a composing member of the IC chip.

8. The IC package according to claim 7 wherein the composing member is a projected electrode.

9. The IC package according to claim 1 wherein the formation means is a recess formed on the circuit substrate.

10. The IC package according to claim 9 wherein the recess is formed in a solder resist on the circuit substrate.

* * * * *